United States Patent [19]
Clark

[11] Patent Number: 5,107,439
[45] Date of Patent: Apr. 21, 1992

[54] CONTINUOUS OVERLAPPING FREQUENCY MEASUREMENT

[75] Inventor: David W. Clark, Santa Clara, Calif.

[73] Assignee: Hewlett-Packard Company, Palo Alto, Calif.

[21] Appl. No.: 612,040

[22] Filed: Nov. 9, 1990

[51] Int. Cl.$^5$ ............................................. G01R 23/02
[52] U.S. Cl. ..................................... 364/484; 377/19; 324/78 D; 364/569
[58] Field of Search ........................... 377/19, 20, 44; 324/78 D, 78 R; 364/484, 569

[56] References Cited

U.S. PATENT DOCUMENTS

| | | | |
|---|---|---|---|
| 4,420,809 | 12/1983 | Pierce | 364/484 |
| 4,434,470 | 2/1984 | Thomas et al. | 377/19 |
| 4,519,091 | 5/1985 | Chu et al. | 377/44 |
| 4,541,105 | 9/1985 | Lee et al. | 377/19 |
| 4,600,994 | 7/1986 | Hayashi | 364/484 |
| 4,786,861 | 11/1988 | Hulsing et al. | 377/19 |
| 4,800,508 | 1/1989 | Frederich | 324/78 D |
| 5,027,298 | 6/1991 | Khazam | 364/569 |

Primary Examiner—John S. Heyman

[57] ABSTRACT

Method and apparatus for frequency measurement of an undulating signal with a time varying frequency. A sequence of consecutive time intervals $T_1$, $T_2$, $T_3$, $T_4$, $T_5$, etc. is determined, and the sum $$\sum_{i=1}^{N} p_{t_{pi}} = \tau_p$$

of times of completion of cycles of the undulating signal within the time interval $T_p$ is determined for $p = 1, 2, 3, 4, 5$, etc. The differences $T_1$, $T_2$, $T_3$, $T_4$, $T_5$, etc. are then used to determine an average frequency within the combined time interval pairs $\{T_1, T_3\}$, $\{T_2, T_4\}$, $\{T_3, T_5\}$, etc.

2 Claims, 4 Drawing Sheets

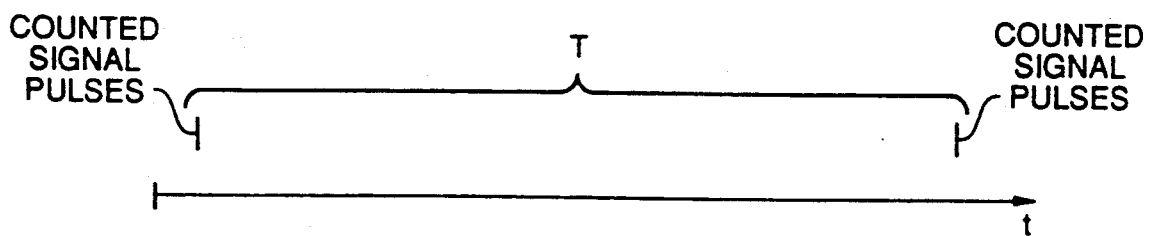
FIG._1
(PRIOR ART)
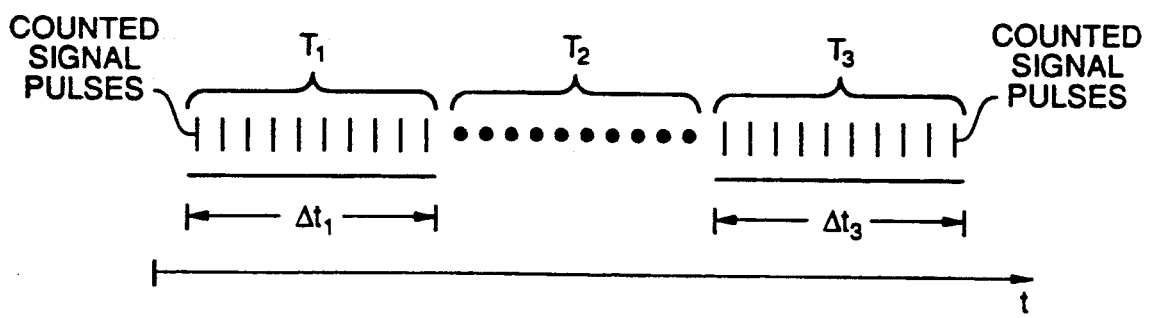
FIG._2
(PRIOR ART)
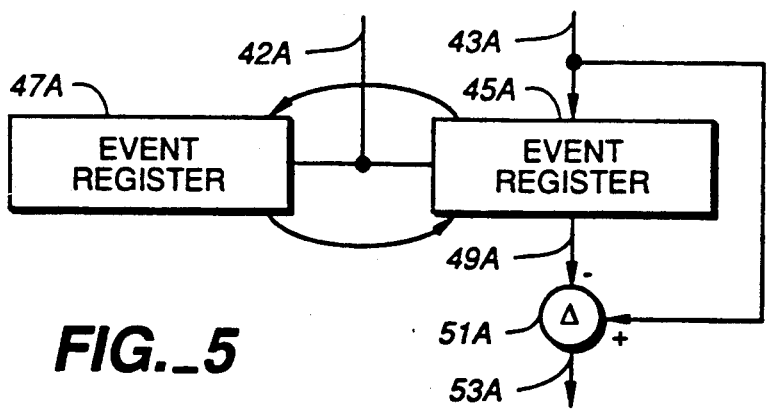
FIG._5
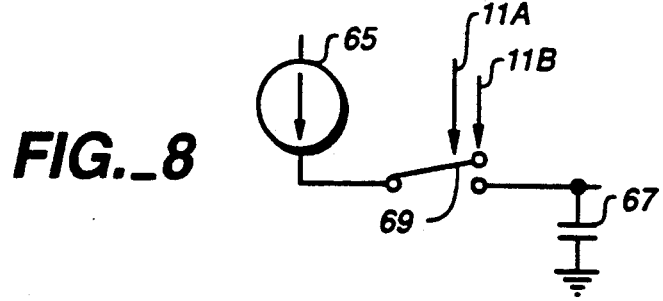
FIG._8

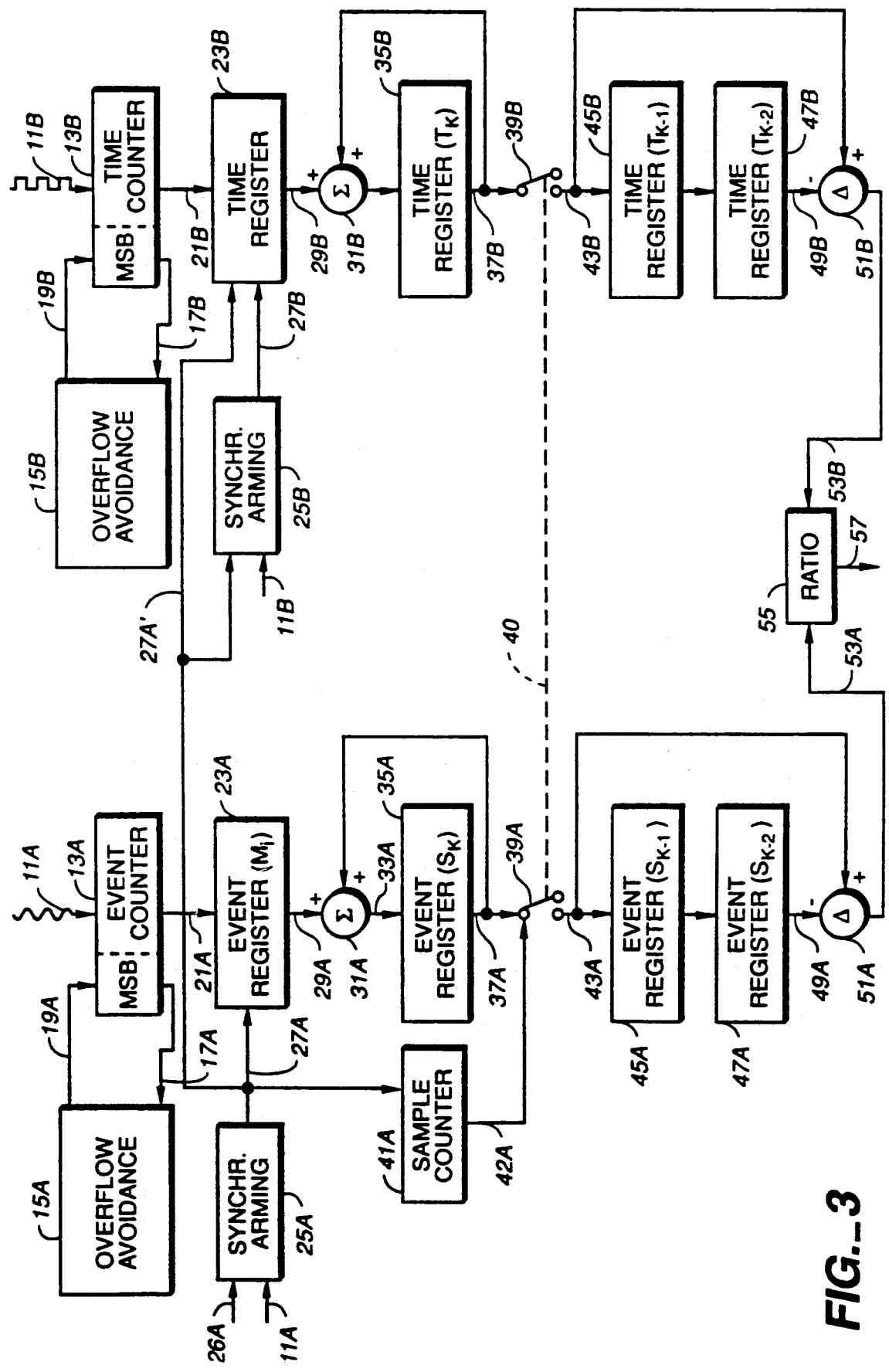
FIG._3

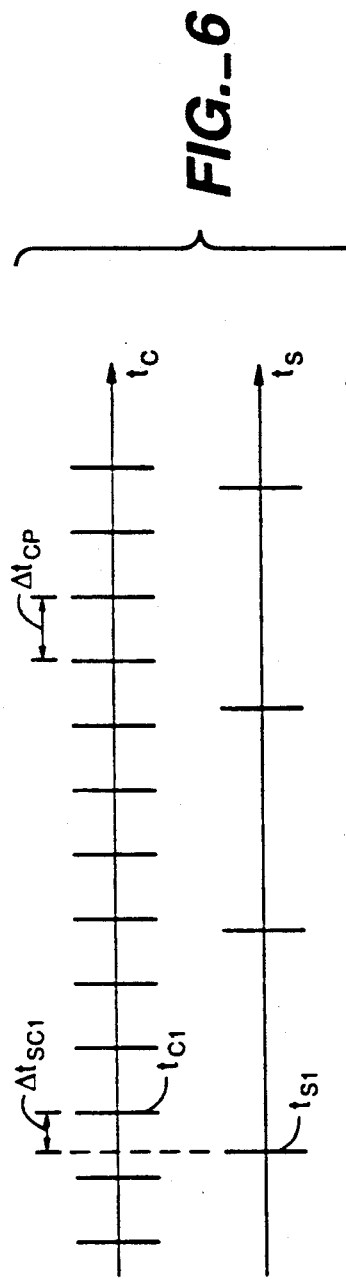
FIG._6
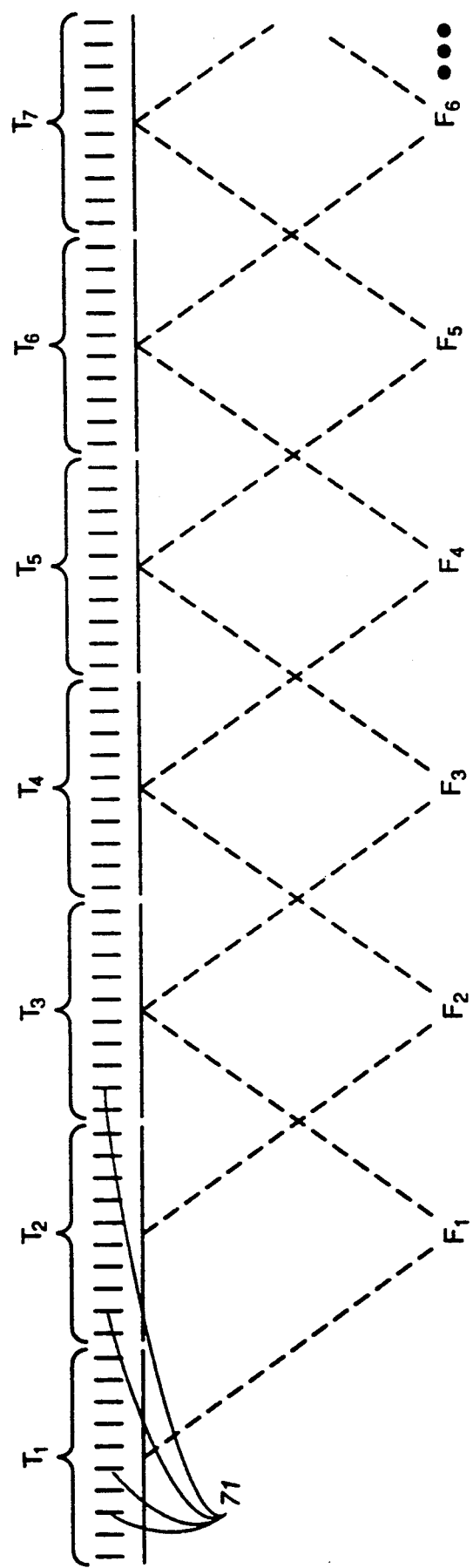
FIG._4

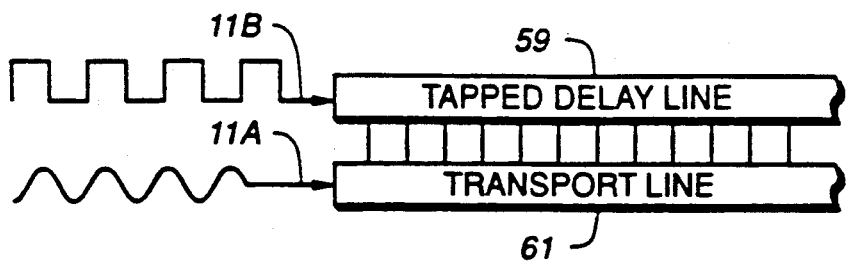
FIG._7
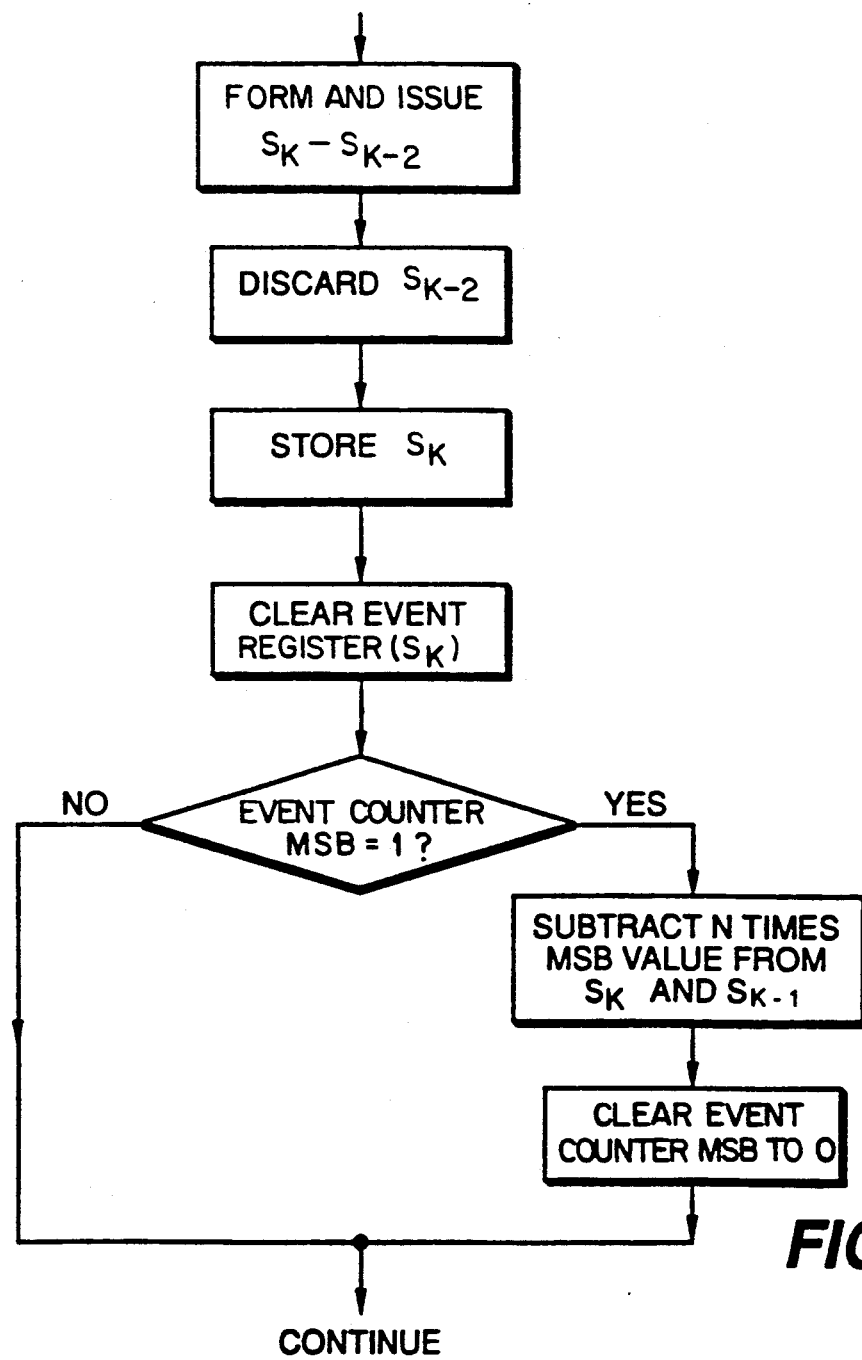
FIG._9

5,107,439

CONTINUOUS OVERLAPPING FREQUENCY MEASUREMENT

DESCRIPTION

Technical Field

This invention relates to frequency measurements on a signal with a time varying frequency.

BACKGROUND OF THE INVENTION

Measurements of signal frequency based upon a cycle counter divide an integer number of input signal cycles by the time interval required to complete those cycles. Although the number of input cycles is exactly known, measuring the start and stop times of the interval itself includes errors from sources such as noise, non-linearity and quantization, which limit the precision of the results. In using a traditional reciprocal counter for frequency measurement, a time interval including precisely N signal cycles is begun and ended, and the start time is subtracted from the stop time to obtain the time interval length for frequency determination. These time interval start/stop measurements can be extended over many signal cycles in order to obtain a high precision average signal frequency value, which is allowed to vary with time. FIG. 1 illustrates this approach, which requires a relatively long time interval to obtain a single sample.

In another approach, sometimes called bicentroid measurement, a time interval is divided into three subintervals, each having approximately the same length. Event numbers, corresponding to events such as zero crossings of the signal, are measured for the first and third of these three intervals, with the second (intervening) time interval being used for instrument recovery or other purposes. The event numbers measured for the first and third of these intervals are then used to obtain an average frequency that represents the signal frequency in these time intervals, collectively. FIG. 2 illustrates the approach here.

One shortcoming of this approach is that the entire set of raw data or frequency measurements must be stored in memory, after which the microprocessor slowly post-processes the data one total time interval at a time. Another shortcoming is that, by the time the microprocessor has post-processed the data to obtain the frequency, time's moving hand has moved on and the frequency measurements are no longer current. Further, the individual frequency measurements are taken with respect to time intervals that are not contiguous to one another. Substantial, and possibly discontinuous, changes in frequency may occur in the intervening time intervals $T_2$. Further, the measurement rate is very low because the length of the time gap between one pair of time intervals $T_1/T_3$ and another similar pair is large compared to the nominal length of $T_1$ or $T_3$.

Several workers have disclosed other approaches to frequency measurement of undulating signals. Chu and Ward, in U.S. Pat. No. 4,519,091, disclose a non-interruptible counter for data capture in which an N-bit counter is arranged as an M-bit, fast, synchronous counter plus an (N−M)-bit, slower, ripple-through counter. The M-bit counter receives the M least significant bits, the (N−M)-bit counter receives the N−M most significant bits, and ripple through of a carry bit occurs slowly only in the latter counter. Each counter has an associated storage device, of size M bits and N−M bits, and entry of data into a storage device is time delayed by a predetermined amount to take account of non-zero bit settling time. First and second parallel counters may be used to count (1) the number of occurrences $\Delta n$ of an event and (2) the length $\Delta t$ of the measurement time interval during which these occurrences are sensed, within a predetermined time interval, and the frequency of occurrences within the measurement time interval is defined as $\Delta n/\Delta t$.

U.S. Pat. No. 4,541,105, issued to Lee et al., discloses receipt of a sample input signal, a reference input signal $F_R$ and a sensor input signal $F_s$ by a counter for frequency sampling purposes. The (low frequency) sample input signal defines a sequence of successive sampling intervals, within which the number of occurrences $n_s$ and $n_R$ of $F_s$ and $F_R$, respectively, at a predetermined level are counted. The reference signal $F_R$ might be a sequence of clock pulses of frequency much higher than the nominal frequency of $F_s$. The frequency of occurrence of the given level of $F_s$ is determined by reference to a ratio of $n_s$ and $n_R$ within each sample interval.

In U.S. Pat. No. 4,786,861, Hulsing and Lee disclose frequency counting apparatus with fractional count capability, using sampling time intervals and sensor signal occurrences that are determined in a manner similar to the occurrences in the Lee et al. patent discussed above. The number of signal cycles $C_n$ sensed in the nth time interval consists of an integer part and a fractional part and is defined by $$C_n = C_{n-1} - \Delta f_{n-1} + \Delta f_n,$$

where $f_n$ is the fractional cycle associated with the nth sampling time interval.

Frederich, in U.S. Pat. No. 4,800,508, discloses frequency measurement apparatus in which the beginning of a sampling interval is synchronized with occurrence of an undulating signal pulse level that is to be counted. The end of a sampling interval appears to be determined by the last occurrence of the given level of the undulating signal within a nominal time interval.

What is needed here is a method of frequency measurement that provides controllably high temporal resolution and takes account of the changes with time of the signal frequency that is extant in a given short time interval. Preferably, the approach should allow frequency measurements with little or no "dead time", should require little or no memory for the raw data received, and should allow for prompt, post-processing so that an average frequency in a given time interval can be displayed shortly after the individual frequency measurements are made.

SUMMARY OF THE INVENTION

These needs are met by a method that allows determination of approximate value of the frequency of an undulating signal whose frequency may vary slowly with time. The method provides clock means that forms a periodic signal and issues an output signal that indicates the time at which each signal cycle of this periodic signal is completed. The method also includes the step of receiving a first plurality of N·n consecutive cycles, numbered i=1,2, ..., N·n, in a time interval $T_1$ of the undulating signal, where N and n are predetermined positive integers, determining from the clock signal the time at which the ith cycle of the signal is completed for i=k·n (k=1,2, ..., N), and forming the sum of time values $$\tau_1 = \sum_{k=1}^{N} t_{k \cdot n}.$$

After a predetermined time delay $\Delta t$, another plurality of N·n consecutive cycles numbered j=1, 2, ..., N·n, is received in a second time interval $T_3$, of the undulating signal, the time $t'_j$ at which the jth cycle of the signal is completed is determined for j=1·N (1=1,2, ..., N), and the sum of time values $$\tau_3 = \sum_{l=1}^{N} t'_{l \cdot n}.$$

is formed. The number n need not be constant but may vary from one plurality of cycles to another. For each time $t_{k \cdot n}$ in the first plurality of cycles and each time $t'_{l \cdot n}$ in the other plurality of cycles, the corresponding cumulative number of cycle completions $M_{k \cdot n}$ and $M'_{l \cdot n}$ are determined. An average frequency value $f_{31}$ for the two time intervals $T_1$ and $T_3$ is then defined by the relation $$f_{31} = \left( \sum_{k=1}^{N} M'_{l \cdot n} - \sum_{k=1}^{N} M_{k \cdot n} \right) / (\tau_3 - \tau_1).$$

These computations are made for a plurality of pairs of overlapping time intervals $\{T_1,T_3\},\{T_2,T_4\},\{T_3,T_5\}$, etc., as indicated in FIG. 4.

BRIEF DESCRIPTION OF THE DRAWINGS

FIG. 1 and 2 are schematic views of determination of average frequency according to methods in the prior art.

FIG. 3 illustrates apparatus useful in determining average frequency of an undulating signal according to the invention.

FIG. 4 illustrates the respective positions of the time latch output pulses $t_c$ and the undulating signal event latch output pulses $t_s$ that are produced by the apparatus shown in FIGS. 2 and 3.

FIG. 5 is a schematic view of serial movement of (event) register contents between two registers in another embodiment of the invention related to the FIG. 2 embodiment.

FIG. 6 illustrates the joint operations of the event latch and the time latch, shown in FIG. 2, to produce the event latch and time latch output signals.

FIGS. 7 and 8 illustrate two methods of time interpolation that may be used in an embodiment of the invention.

FIG. 9 illustrates the overflow avoidance procedure used with the event and time counters.

BEST MODE FOR CARRYING OUT THE INVENTION

With reference to FIG. 3, an undulating signal of possibly variable frequency is carried on a first input line 11A and is received by an event counter 13A that counts the number of occurrences of a given level or other event in the signal S, for example, the number of zero crossings with a negative-to-positive transition. The counter 13A is a continuous measurement counter that is not cleared or reset, except possibly through number overflow control. Overflow is controlled or avoided by providing an overflow avoidance ("OA") module 15A, discussed below, that receives the most significant bit ("MSB") of the number contained in the counter 11A on an OA module input line 17A and issues a reset command for this MSB on an OA module output line 19A, received by the event counter 13A. An event counter output line 21A carries the count to a first event register 23A that receives and temporarily holds an event count value therein.

The first event register 23A receives a synchronized arming signal from a synchronized event arming module 25A on an arming output line 27A. If the first event register 23A is not enabled by receipt of an arming signal from the arming module 25A, the present event count signal is ignored and not received by the event register 23A. If the first event register 23A is enabled by receipt of an arming signal, the present event count signal $M_i$ is received from the event counter 13A and is issued from time to time on an event register output line 29A as each new event count signal is received by the first event register 23A. The arming module 25A receives an arming input signal on an arming input line 26A and receives the undulating signal itself on the input line 11A. Both of these signals must be present before the arming module 25A issues an arming signal to enable or activate the first event register 23A.

The event count signal carried on the first event register output line 29A is received at a first input terminal of a two-input event sum module 31A, with a second signal being received at a second input terminal of the event sum module 31A. The sum of these two input signals is formed and issued at an output terminal of the sum module 31A. This sum represents a cumulative sum of the preceding event count signals $$S_K = \sum_{i=1}^{K} M_i$$

received at each enablement of the first event register 23A by the arming module 25A. The number of events that occur between two consecutive arming signals issued on the line 27A (a sampling interval) can be a constant m, where m=1,2,3, ... is a predetermined positive integer, or the number m can vary from one sampling interval to the next. An event sum output line 33A delivers the output signal $S_K$ from the event sum module 31A to a second event register 35A at an input terminal thereof. The contents of the second event register 35A are issued on a second event register output line 37A and are received by the second input terminal of the event sum module 31A. The first event register output signal, representing the sum $S_K$ of event numbers (occurrences of the predetermined "event") for each enablement of the first event register 23A, is also received by an input terminal of an event count-controlled switch 39A that is normally in the open position, as shown in FIG. 3. A sample counter 41A receives and counts each arming signal issued on the output line 27A by the arming module 25A. When the sample count $$\sum_{i=1}^{J} 1 = J,$$

contained in the sample counter 41A reaches a predetermined positive integer N, (1) the sample counter 41A issues a switch control signal on an event count output control line 42A that briefly closes the event switch 39A, (2) which allows the accumulated event count signal $S_K$ in the first event register to flow through the switch 39A to an event count transport line 43A, and (3) the second event register 35A is then cleared and its contents are re-initialized to zero event count. The event switch 39A then re-opens for another N event count. The event switch 39A, and similarly the time switch 39B discussed below, need not be a physical switch. These switches may be gates that allow passage of the contents of the appropriate event register 35A and 35B whenever the sample count in the sample counter 41A reaches a predetermined number.

The event count register output signal $S_{K-1}$ carried on the event count transport line 43A is received by a third event register 45A and temporarily held therein. A fourth event register 47A holds a fourth cumulative event count $S_{K-2}$ therein. The event count numbers $S_K$, $S_{K-1}$ AND $S_{K-2}$ held in the second, third and fourth event count registers 35A, 45A and 47A, respectively, are the event counts accumulated in the current block of time, the immediately preceding ("second") block of time, and the block of time that immediately precedes this "second" block of time. Each of the event count numbers $S_K$, $S_{K-1}$ and $S_{K-2}$ is a sum of event count numbers, as indicated above.

Two alternative embodiments are available here. In a first embodiment, shown in FIG. 3, the second and third event registers 45A and 47A are arranged in pipeline fashion so that the event counts $S_K$ and $S_{K-2}$ contained in the second and fourth event registers 35A and 47A refer to cumulative event counts in non-contiguous time blocks or time intervals, such as $T_1$ and $T_3$ in FIG. 4. A two-input difference module 51A receives the event count signal $S_K$ on the event transport line 43A at its positive input terminal, and receives the event count output signal $S_{K-2}$ on an event register output line 49A from the fourth event register 47A at its negative input terminal. The difference module 51A then forms and issues an event count difference signal $S_K - S_{K-2}$ on an event count difference output line 53A.

In a second arrangement of the event registers 45A and 47A, illustrated schematically in FIG. 5, the third and fourth event registers 45A and 47A contain the event counts $S_{K-1}$ and $S_{K-2}$, respectively, and are positioned in tandem. The third event register has just received the event count $S_{K-1}$ from the event count transport line 43A. The two event registers 45A and 47A then receive the switch control signal on the control line 42A, and the contents of these two event registers are exchanged. Now, event register 45A contains the event count $S_{K-2}$ and the event register 47A contains the event count $S_{K-1}$. The output terminal on the third event register 45A is then activated, and the output signal $S_{K-2}$ appears on the event register output line 49A and is received at the negative input terminal of the difference module 51A. The difference module 51A receives the event count signal $S_K$ on the event count transport line 43A and forms and issues the event count difference signal $S_K - S_{K-2}$ on the event count difference output line 53A as with the first embodiment.

In a similar manner, a time counter 13B receives a sequence of periodic clock pulses on a time input line 11B. The time counter 13B, overflow avoidance module 15B, first time register 23B, synchronous arming module 25B, time sum module 31B, second time register 35B, time switch 39B, third time register 45B, fourth time register 47B and time difference module 51B operate together in a manner similar to operation of the event counter 13A, overflow avoidance module 15A, first event register 23A, synchronous arming module 25A, event sum module 31A, second event register 35A, event switch 39A, third event register 45A, fourth event register 47B and event difference module 51A, respectively, with the following differences. First, the synchronous arming module 25B receives as its arming signal the arming module (25A) output signal produced on output line 27A and receives the clock input signal on line 11B at its second input terminal. Second, the time switch 39B is opened and closed at times corresponding to the times the event switch 39A is opened and closed, respectively, rather than by the time count present in any time sample counter. Third, the contents of the second time register 35B are re-initialized whenever the time switch 39B is closed.

A number of undulating signal occurrences in each of a sequence of non-overlapping, consecutive time intervals $T_1$, $T_2$, $T_3$, $T_4$, $T_5$, $T_6$, $T_7$, etc., are shown in FIG. 4. The second and fourth event registers 35A and 47A contain the cumulative number of undulating signal events, denoted $S_K$ and $S_{K-2}$, respectively, sensed by the counter 11A in FIG. 3 for the third (in time) and first (in time) blocks or time intervals $T_3$ and $T_1$, respectively, of FIG. 4.

The event difference module output signal, carried on output line 53A in FIG. 3, is thus $\Delta S_{31} = S_3 - S_1$ or $S_4 - S_2$, or $S_5 - S_3$, or $S_6 - S_4$, or $S_7 - S_5$, or ... for two non-contiguous time intervals as shown in FIG. 4. In an analogous manner, the second and fourth time register modules 35B and 47B contain the respective sums $$\sum_{t_i \in T_3} t_i \text{ and } \sum_{t_j \in T_1} t_j$$

of times contained in the time intervals $T_3$ and $T_1$ that correspond to sampling of an undulating signal event in these respective time intervals. The time difference module output signal, carried on output line 53B in FIG. 2, is thus $$\Delta \tau_{31} = \sum_{t_i \in T_3} t_i - \sum_{t_j \in T_1} t_j. \tag{1}$$

A ratio-forming module 55 receives the two signals $\Delta S$ and $\Delta \tau$ and forms and issues a ratio output signal $$r_{31} = \Delta S_{31} / \Delta \tau_{31} \tag{2}$$

$$= (S_3 - S_1) / \left( \sum_{t_i \in T_3} t_i - \sum_{t_j \in T_1} t_j \right)$$

on a ratio module output line 57. More generally, the ratio $$r_{p+2,p} = \Delta S_{p+2,p} / \Delta \tau_{p+2,p} \tag{3}$$

$$= (S_{p+2} - S_p) / \left( \sum_{t_i \in T_{p+2}} t_i - \sum_{t_j \in T_p} t_j \right)$$

$(p = 1, 2, 3, \ldots)$ is formed by the ratio-forming module 55 and issued on the output line 57.

Each of the ratios $r_{31}$, $r_{42}$, $r_{53}$, etc. has the units of (time)$^{-1}$ and is treated as an average undulating signal frequency in the combined time interval pairs $\{T_1, T_3\}$, {T$_2$,T$_4$}, {T$_3$,T$_5$}, etc. These average frequencies r$_{31}$, r$_{42}$, r$_{53}$, etc. may vary from one time interval pair to another. If the cycle-to-cycle frequency variations were monitored, corresponding to N=1 for the switches 39A and 39B, the variations would likely be relatively large compared to a nominal or representative value of the undulating signal frequency.

Measuring a varying frequency involves a compromise between measurement rate and measurement precision. Following more rapid frequency variations requires a faster measurement rate, but obtaining more precision requires a slower measurement rate. This invention allows both precision and measurement rate to be optimized to an extent not previously attainable. The precision and rate of the new method are compared to a traditional reciprocal frequency counter method below. A traditional interpolating reciprocal frequency counter measurement, such as that illustrated in FIG. 1 or FIG. 2, can be expressed mathematically as:

$$f_K = \frac{M_K - M_{K-1}}{t_K - t_{K-1}} = K\text{th frequency measured.} \quad (4)$$

The numerator is an exact integer—there is no error in measuring events. However, each time measurement $t_K$ appearing in the denominator has some associated random error due to measurement noise and nonlinearity. Assuming independent identically distributed errors, the mean error will cancel due to the subtraction, and the variances in the denominator will add, so that the standard deviation of the difference of the two times in the denominator will be $\sqrt{2}$ times the standard deviation $\sigma_t$ of one sample. Since the errors are a very small fraction of the time interval $\Delta t_K = t_K - t_{K-1}$, the fractional frequency precision will be very close to the fractional time interval precision (higher order terms are negligible). This fractional precision is therefore $$\frac{\sigma_f}{f_K} = \frac{\sqrt{2}\,\sigma_t}{\Delta t_K} \quad (5)$$

For a given value of $\sigma_t$, the only way to improve the pre- of this type of measurement is to measure more slowly—increase the value of $\Delta t_K$.

With the technique disclosed here, individual samples are effectively replaced by sums of samples, and the measurement time intervals are effectively twice as long but overlapped:

$$f_K = \left(\sum_{i=1}^{K} M_i - \sum_{i=1}^{K-2} M_i\right) \Big/ \left(\sum_{t_j \in S_K} t_j - \sum_{t_j \in S_{K-2}} t_j\right) \quad (6)$$

$$\Delta t_{K,K-2} = \sum_{t_j \in T_K} t_j - \sum_{t_j \in T_{K-2}} t_j \quad (7)$$

The numerator is still an exact integer, the mean error still cancels due to subtraction, variances still add, and the fractional errors are still very small (allowing higher order terms to be neglected). But now there are 2N time samples, each with variance $\sigma_t$ and N time intervals in the denominator. Therefore the fractional precision is:

$$\frac{\sigma_f}{f_K} = \frac{\sqrt{2N\sigma_t^2}}{N2\Delta t_K} = \frac{\sigma_t}{\sqrt{2N}\,\Delta t_K} \quad (8)$$

It can be seen that this provides improved precision, for a given standard deviation $\sigma_t$ and nominal time interval $\Delta t_K$, than does a traditional reciprocal counter method, even for N=1. As N is increased, the measurement precision improves rapidly. Thus, it provides better precision for the same measurement rate, or faster measurement rate for the same precision, than previous methods.

The arming module output signal received by the event register 23A will generally precede the arming module output signal received by the time register 23B by a variable amount of time $\Delta t_{sc1}$. FIG. 6 illustrates a sequence of periodic clock pulse timing marks $t_c$ and a sequence of not-necessarily-periodic event timing marks $t_s$, referenced to the same time base t. Assume that an arming signal has been received by the arming module 25A on the arming signal input line 26A at some time before receipt of the event timing mark designated $t_{s1}$ in FIG. 6. Upon receipt of the event time mark $t_{s1}$, the event arming module 25A will issue an event arming signal on the arming module output line 27A, which signal will be received by the first event register 23A and by the time arming module 25B. The first event register 23A will immediately issue the current event count signal $M_i$ ($i=K+1$) on the event register output line 29A, and the signal $M_i$ will be received by the event sum module 31A and added to the cumulative event count sum $S_K$.

The time arming module 25B will not issue a time arming signal on the arming module output line 27B until this arming module has also received the next clock pulse timing mark $t_{cl}$. The clock pulse timing mark $t_{cl}$ occurs at a time $t=t_{s1}+\Delta t_{sc1}$ as illustrated in FIG. 6, and at the time $t=t_{cl}$ the time register 23B immediately issues the current time count signal ($t \approx t_{cl}$) on the time register output line 29B. This current time count signal is received by the time sum module 31B and added to the cumulative time count $\Sigma t_j$. The current time count signal received by the time sum module 31B has a value $t=t_{cl}$ that is greater by the amount $\Delta t_{sc1}$ than the time $t=t_{s1}$ at which the corresponding event number $M_i$ ($i=K+1$) is issued. The variable time delay amount $\Delta t_{sc1}$ ranges from 0 to $\Delta t_{cp}$, where $\Delta t_{cp}$ is the constant period of the sequence of clock pulses.

This time delay $\Delta t_{sc1}$ may be accounted for by an optional time interpolation sub-module (not shown separately) contained in, or associated with, the first time register 23B. The time register 23B will receive the event arming module output signal on an optional line 27A' from the event arming module 25A and will determine the time delay $\Delta t \approx \Delta t_{sc1}$ between receipt of this output signal and receipt of the time arming module output signal on the output line 27B. This time delay amount $\Delta t \approx \Delta t_{sc1}$ will be subtracted from the time $t=t_{cl}$ received by the time register 23B from the time counter 13B. The time interpolation amount $\Delta t \approx \Delta t_{sc1}$ can be determined by any of a number of methods that are well known in the art: (1) use of a tapped delay line 61 for the clock pulse signal timing mark sequence relative to a signal transport line 63 for the sequence of event timing marks, as illustrated in FIG. 7; or (2) measurement of accumulated charge from a constant current source 65 that feeds a capacitor 67 through a switch 69 that is closed by receipt of the event timing mark at time $t=t_{s1}$ and is subsequently opened by receipt of the clock pulse timing mark at time $t=t_{c1}$, as illustrated in FIG. 8. Other time interpolation methods may also be used to determine or estimate the time delay amount $\Delta t_{sc1}$.

As the counter 13A (or 13B) in FIG. 3 counts upward, it eventually reaches its maximum value 111 ... 11. Receipt of one additional count will cause the counter to make a transition to 000 ... 00, through the usual carry operation. The overflow avoidance module 15A (or 15B) checks the MSB of the counter 13A (or 13B) between two consecutive time intervals. If the MSB of the count value has the value one (1) at that time, the MSB is cleared to zero (0) so that counter overflow does not occur during the next time interval. The effective maximum event count (or time count) is thus always less than the maximum count the counter is able to record. The bits of lower significance (other than the MSB) of the counter are not affected so that continuous, overlapped event or time measurement proceeds as before. By clearing or resetting the MSB, the MSB value is effectively subtracted from all future latched values in the first event register 13A or time register 13B. Between two consecutive times at which the event switch 39A is closed, N events occur so that the value of the signal transferred on the event register output line 37A (or 37B) when the switch 39A (or 39B) is closed is effectively reduced by a value $N_c$ equal to N times the MSB value of the corresponding counter 13A (or 13B). In order to correct the signal values held on the signal transport line 43A (or 43B), in the third register 45A (or 45B), and in the fourth register 47A (or 47B), this value $N_c$ should be subtracted from each of the past sums of event numbers (or time numbers). The overflow avoidance modules 15A and 15B for the event counter 13A and time counter 13B, respectively, operate independently. FIG. 9 schematically illustrates operation of the overflow avoidance procedure for the event numbers $M_i$ and their sums $S_{K-1}$ and $S_K$.

The first event register 13A and first time register 13B in FIG. 3 are each 28 bits in length in a preferred embodiment. The event registers 35A, 45A and 47A and the time registers 35B, 45B and 47B each contain a sum of event count numbers and may have greater bit lengths, such as 56.

As noted above, the two non-contiguous sequences of pulses denoted $T_1$ and $T_3$ in FIG. 2 are used for undulating signal event counting in the prior art. In the invention disclosed and claimed herein, undulating signal events are counted for pairs of non-contiguous time intervals $\{T_1,T_3\}$, $\{T_2,T_4\},\{T_3,T_5\},\{T_4,T_6\},\{T_5,T_7\}$, etc., as illustrated in FIG. 4, but two consecutive pairs of such time intervals overlap so that an entire corrected time interval such as $T_1 \cup T_2 \cup T_3 \cup T_4 \cup T_5 \cup T_6 \cup T_7$ is covered by the event sampling. This latter approach has at least two advantages. First, the number of undulating signal events thus sampled is much larger and includes events in all portions of a larger time interval. Second, because the number of sampled signal events is increased (by a factor much greater than two), aliasing in the frequency domain is substantially reduced.

I claim:

1. A method for determining frequency of an undulating signal whose frequency may vary with time, the method comprising the steps of:

providing clock means having an output terminal, for forming a periodic clock signal that executes a plurality of substantially identical consecutive signal cycles and for issuing at the output terminal a clock signal that indicates the time at which each signal cycle of the periodic signal is completed;

receiving a first plurality of N·M consecutive cycles, numbered $i=1,2,\ldots,$ N·m, of the undulating signal, where N and m are predetermined positive integers, determining from the clock signal the time $t_i$ at which the $i^{th}$ cycle of the undulating signal is completed, and forming the sums $$S_{K,1} = K \cdot m \ (K = 1, 2, \ldots, N)$$

$$\tau_{m \cdot K,1} = \sum_{i=1}^{m \cdot K} t_i$$

representing the sum of the number of signal cycles and the sum of the times at which the signal cycles were completed, respectively, for the first plurality of cycles;

receiving a second plurality of N·M consecutive cycles, numbered $j=1,2,\ldots,$ N·m, of the undulating signal, that is preceded by the first plurality of cycles, determining from the clock signal the time $t'_j$ at which the jth cycle of the undulating signal is completed, and forming the sums $$S_{K,2} = K \cdot m \ (K = 1, 2, \ldots, N)$$

$$\tau_{m \cdot K,2} = \sum_{j=1}^{m \cdot K} t'_i$$

representing the sum of the number of signal cycles and the sum of the times at which the signal cycles were completed, respectively, for the second plurality of cycles;

receiving a third plurality of N·m consecutive cycles, numbered $K=1,2,\ldots,$ N·m, of the undulating signal, that is preceded by the second plurality of cycles, determining from the clock signal the time $t_k''$ at which the $k^{th}$ cycle of the undulating signal is completed, and forming the sums $$S_{K,3} = K \cdot m \ (K = 1, 2, \ldots, N)$$

$$\tau_{m \cdot K,3} = \sum_{k=1}^{m \cdot K} T_{k''}$$

representing the sum of the number of signal cycles and the sum of the times at which the signal cycles were completed, respectively, for the third plurality of cycles;

receiving a fourth plurality of N·m consecutive cycles, numbered $n=1,2,\ldots,$ N·m, of the undulating signal, that is preceded by the third plurality of cycles, determining from the clock signal the time $t_n'''$ at which the nth cycle of the undulating signal is completed, and forming the sums $$S_{K,4} = K \cdot m \ (K = 1, 2, \ldots, N)$$

$$\tau_{m \cdot K,4} = \sum_{n=1}^{m \cdot K} T_n$$

representing the sum of the number of signal cycles and the sum of the times at which the signal cycles were completed, respectively, for the fourth plurality of cycles; and forming a first difference ratio $$f_{31} = \left( \sum_{k=1}^{N} S_{K,4} - \sum_{k=1}^{N} S_{K,2} \right) / (\tau^{M,N,3} - \tau^{M,N,1}),$$

and a second difference ratio $$f^{31} = \left( \sum_{k=1}^{N} S^{K,3} - \sum_{k=1}^{N} S^{K,1} \right) / (\tau_{M,N,4} - \tau_{M,N,2}),$$

as two representative undulating signal frequencies for the combined first and third pluralities of signal cycles, and for the second and fourth pluralities of signal cycles, respectively.

2. Apparatus for determining frequency of an undulating signal whose frequency may vary with time, the apparatus comprising:

counter means, having a plurality of input terminals and two output terminals for receiving the undulating signal at a first input terminal, for receiving a clock signal that measures the passage of time at a second input terminal, for receiving four consecutive arming signals $N_1$, $N_2$, $N_3$, $N_4$ at a third input terminal, where $N_1$, $N_2$, $N_3$ and $N_3$ are positive integers, for determining the time $t_{pi}$ ($i=1,2,\ldots,N$; $p=1,2,3,4$) of completion of an ith consecutive cycle of the undulating signal received at the first input terminal, during a predetermined time interval $T_p$ ($p=1,2,3,4$), where the time intervals $T_1$, $T_2$, $T_3$ and $T_4$ follow one in order and $T_1$ and $T_3$ do not overlap in time, and $T_2$ and $T_4$ do not overlap in time, where $M_{pi}$ is the number of consecutive cycles completed within the time interval $T_p$ ($p=1,2,3,4$) at time $t_{pi}$, and for forming and issuing four output time signals $$\tau_1 = \sum_{i=1}^{N_1} t_{1i}, \quad \tau_2 = \sum_{i=1}^{N_2} t_{2i},$$

$$\tau_3 = \sum_{i=1}^{N_3} t_{3i} \text{ and } \tau_4 = \sum_{i=1}^{N_4} t_{4i}$$

and four output event signals $$S_p = \sum_{i=1}^{N_1} M_{pi} \ (p = 1, 2, 3, 4); \text{ and}$$

measurement processing means, having two input terminals and an output terminal, for receiving the counter means output signals $T_1$, $T_2$, $T_3$ and $T_4$ at the first input terminal and the arming count signals $N_1$, $N_2$, $N_3$ and $N_4$ at the second input terminal, for forming the ratio of the differences $$f_{31} = (S_3 - S_1)/(\tau_3 - \tau_1)$$

$$f_{42} = (S_4 - S_2)/(\tau_4 - \tau_2),$$

as two representative values of the frequency of the undulating signal.

* * * * *